(12) United States Patent
Satoh

(10) Patent No.: US 6,294,964 B1
(45) Date of Patent: Sep. 25, 2001

(54) HIGH-STABILITY PIEZOELECTRIC OSCILLATOR

(75) Inventor: Tomio Satoh, Kouza-gun (JP)

(73) Assignee: Toyo Communication Equipment Co., Ltd., Kanagawa (JP)

(*) Notice: Subject to any disclaimer, the term of this patent is extended or adjusted under 35 U.S.C. 154(b) by 0 days.

(21) Appl. No.: 09/497,054

(22) Filed: Feb. 2, 2000

(30) Foreign Application Priority Data

Feb. 2, 1999 (JP) .................................................. 11-024489
Sep. 28, 1999 (JP) .................................................. 11-274556

(51) Int. Cl.<sup>7</sup> ...................................................... H03B 5/32
(52) U.S. Cl. ............................... 331/116 R; 331/117 R; 331/158; 331/167
(58) Field of Search ......................... 331/117 R, 158, 331/116 R, 167

(56) References Cited

U.S. PATENT DOCUMENTS 4,378,532 * 3/1983 Burgeon ................................ 331/158

* cited by examiner

*Primary Examiner*—Arnold Kinkead
(74) *Attorney, Agent, or Firm*—Koda & Androlia

(57) ABSTRACT

To obtain means for suppressing a jump phenomenon to a B mode in a Colpitts oscillator using an SC-cut crystal unit. In a Colpitts oscillator including a piezoelectric resonator and an amplifier circuit, a series resonance circuit and a parallel resonance circuit consisting of an inductance and a capacitance are inserted into an oscillation loop, and the frequency of the series resonance circuit is set in the vicinity of the oscillation frequency of the oscillator, and the frequency of the parallel resonance circuit is set in the vicinity of an unwanted oscillation frequency of the oscillator, thereby to suppress the unwanted oscillation.

6 Claims, 8 Drawing Sheets

HIGH-STABILITY PIEZOELECTRIC OSCILLATOR

BACKGROUND OF THE INVENTION

1. Field of the Invention

The present invention relates to a high-stability piezoelectric oscillator, and more particularly relates to a Colpitts oscillator having high-stability oscillation characteristics in which a piezoelectric resonator, for example, an SC-cut crystal unit is used, and which can suppress spurious.

2. Description of the Related Art

Piezoelectric oscillators have been used in many fields including a base station for mobile communications, a measuring apparatus, etc. Because the piezoelectric oscillator has an excellent oscillation precision, excellent frequency-temperature characteristics, excellent aging characteristics, etc.

When a doubly rotated crystal resonator, for example, an SC-cut crystal resonator or an IT-cut crystal resonator is used for a piezoelectric unit for use in the piezoelectric oscillator, it is possible to obtain a high-stability piezoelectric oscillator superior in stress sensitivity and thermal shock characteristics and the like, as compared with the case where an AT-cut crystal resonator is used for the piezoelectric unit. Because of such excellent characteristics, SC-cut crystal units or IT-cut crystal units have been studied and put into practical use since twenty-odd years ago.

FIG. 5 is a diagram for showing resonance characteristics of an SC-cut crystal unit. The horizontal axis represents the frequency and the vertical axis represents the reactance.

As is clear from this diagram, the main oscillation is a thickness-shear mode (C mode), and there exist a thickness-twist mode (B mode) and a thickness-longitudinal mode (A mode) and the like as oscillation modes with a higher frequency.

Accordingly, the oscillations of the B mode, the A mode and the like other than the C mode have been a cause of generating various inconveniences as spurious (unwanted response) at the time of constructing an oscillator.

Particularly, as frequency f2 of the B mode adjacent to the C mode as the main oscillation is at a distance of only about 9 to 10% from frequency f1 of the C mode, this has been a cause of generating a frequency jump that the oscillation frequency f1 changes to the frequency f2.

FIG. 6 shows a prior art disclosed in Japanese Patent Application Laid-open No. 9-15740 for solving the above problems. According to this patent application, a collector of a transistor Tr is connected to a power source Vc, and further, one end of a crystal unit Y1 is connected to the base of the transistor Tr and the other end of the crystal unit Y1 is connected to the ground through a variable capacitance Cv.

Then, a series circuit of capacitances C1 and C2 are connected between the base of the transistor Tr and the ground, and a crystal unit Y2 is provided between an emitter of the transistor Tr and an intermediate point (division point) of the series circuit of C1 and C2.

In FIG. 6, reference symbols R2 and R3 represent bleeder resistors, and R1 represents a feedback resistor (load resistor). An output V0 is obtained from both ends of the load resistor R1.

The crystal unit Y2 is set such that the series resonance frequency of the crystal unit Y2 substantially coincides with the oscillation frequency of the main oscillation (C mode) by using, for example, an AT-cut crystal unit.

FIG. 7 is a graph for showing negative resistance characteristics. FIG. 7 shows a negative resistance a of the oscillation circuit shown in FIG. 6 and a negative resistance b of a general Colpitts oscillator for comparison.

In this case, the negative resistance refers to a real number portion of an impedance presented when, for example, in the oscillation circuit shown in FIG. 6 after excluding the crystal unit Y1 and the variable capacitance Cv, the oscillation circuit side is looked at from the terminal connecting the crystal unit, that is a connection point of the bleeder resistors R2 and R3 and the earth. As the real number portion of the impedance shows a negative resistance in the vicinity of the oscillation frequency, this is called a negative resistance.

It is known that an oscillation is easily generated when the negative resistance becomes larger. However, it is general that the negative resistance is set at a value of about a few times of an effective resistance of the crystal unit for the reasons of minimizing power consumption and restricting unwanted oscillation.

In this case, the effective resistance of the crystal unit refers to a resistance of a crystal unit itself in the resonance frequency of each mode.

The negative resistance a makes the feedback circuit having a frequency selectivity when the crystal unit Y2 is inserted between the intermediate point of the series circuit of the capacitances C1 and C2 and the emitter of the transistor. As compared with the negative resistance characteristic b of the general Colpitts oscillator, the negative resistance characteristic becomes a narrow band. In the frequency (10.0 MHz) of the C mode of the main oscillation, a sufficiently large negative resistance is shown, but a small negative resistance is shown or a positive resistance is shown in the frequency (10.9 MHz) of the B mode. Thus, it is not possible to oscillate in the frequency of the B mode.

FIG. 8 shows a modified embodiment disclosed in the above-described patent application laid-open. This shows an oscillation circuit of the case where the crystal unit Y2 in FIG. 6 has been substituted by a series circuit of an inductance L and a capacitance C3. The series resonance frequency of the inductance L and the capacitance C3 is set to coincide with the frequency of the C mode of the main oscillation.

There is described in the above publication that, as shown by a one-dot chain line c in FIG. 7, the negative resistance characteristics of this oscillation circuit has a frequency characteristics of a relatively larger than that of the curve a, and shows a sufficiently large negative resistance in the frequency of the C mode of the main oscillation, but, in the frequency of the B mode, this value becomes smaller, and it is not possible to oscillate in this mode.

When the oscillation circuit shown in FIG. 6 is used, the negative resistance characteristics becomes narrow band characteristics and there occurs no frequency jump phenomenon due to the B mode. However, there has been a problem that as this oscillation circuit requires an AT-cut crystal unit of high stability, the oscillator becomes expensive.

Further, a high-stability piezoelectric oscillator has been actually manufactured as a trial by using the oscillation circuit shown in FIG. 8, and negative resistance of this oscillation circuit has been measured. As a result, a negative resistance characteristic as shown in FIG. 9 has been obtained.

As shown by an arrow mark a in FIG. 9, a sufficient negative resistance (equal to or less than −1 kΩ) was obtained in the main oscillation (C mode). However, a large negative resistance (about −400 Ω) was also obtained even in the frequency of the B mode shown by an arrow mark β. Particularly, when the SC-cut crystal unit is used, the oscillation level of the B mode becomes larger than other cut angles, and some oscillation levels become equal to those of the C mode. Therefore, there has been a problem that there is a risk of an occurrence of a frequency jump phenomenon to the B mode.

SUMMARY OF THE INVENTION

With a view to solving the above-described problems, it is an object of the present invention to provide preventing means for avoiding a frequency jump phenomenon to the B mode at low cost.

In order to achieve the above object, according to a first aspect of the present invention, there is provided a Colpitts oscillator including a piezoelectric unit and an amplifier circuit, wherein a composite circuit network consisting of an inductance and a capacitance is inserted into and connected with an oscillation loop, a series resonance frequency of the composite circuit network is set in the vicinity of the oscillation frequency of the oscillator, and a parallel resonance frequency of the composite circuit network is set in the vicinity of an unwanted oscillation frequency of the oscillator, thereby to suppress the unwanted oscillation.

According to a second aspect of the invention, there is provided Colpitts oscillator including a piezoelectric unit, a transistor amplifier, and at least capacitances C1 and C2 inserted in series into the piezoelectric resonator and a feedback resistor R1 connected between the emitter of the transistor of the amplifier and the ground, wherein a series connection of capacitances C3 and C4 is provided between the emitter of the transistor and the ground, and an inductance is inserted into between and connected with the connection point between the capacitances C3 and C4 and the connection point between the capacitances C1 and C2 so that a composite circuit network is formed including the inductance, the capacitances C1, C2, C3 and C4 in the oscillation loop, and a series resonance frequency of the composite circuit network is set in the vicinity of the oscillation frequency and a parallel resonance frequency of the composite circuit network is set in the vicinity of an unwanted oscillation frequency of the oscillator, thereby to suppress the unwanted oscillation.

According to a third aspect of the invention, there is provided a Colpitts oscillator as defined by the second aspect, wherein a circuit having a fixed inductance L1 and a variable reactance Z connected in series is used as the inductance.

According to a fourth aspect of the invention, there is provided a Colpitts oscillator including a piezoelectric resonator, a transistor amplifier, at least capacitances C1 and C2 inserted in series into the piezoelectric resonator, and a feedback resistor R1 connected between the emitter of the transistor of the amplifier and the ground, wherein a series connection of capacitances C3 and C4 is disposed between the emitter of the transistor and the ground, and a parallel circuit of an inductance and a capacitance is inserted into between and connected with the connection point between the capacitances C3 and C4 and the connection point between the capacitances C1 and C2 so that a composite circuit network is formed including the parallel circuit, the capacitances C1, C2, C3 and C4 in the oscillation loop, and a series resonance frequency of the composite circuit network is set in the vicinity of the oscillation frequency and a parallel resonance frequency of the composite circuit network is set in the vicinity of an unwanted oscillation frequency of the oscillator, thereby to suppress the unwanted oscillation.

According to a fifth aspect of the invention, there is provided a Colpitts oscillator as defined by the first, second, and fourth aspects, wherein the piezoelectric resonator is an SC-cut crystal unit, and the series resonance frequency of the composite circuit network is set in the vicinity of a fundamental mode oscillation frequency of the oscillator, and the parallel resonance frequency of the composite circuit network is set in the vicinity of a B-mode resonance frequency of the SC-cut crystal unit.

According to a sixth aspect of the invention, there is provided a Colpitts oscillator as defined by the third aspects, wherein the piezoelectric resonator is an SC-cut crystal unit, and the series resonance frequency of the composite circuit network is set in the vicinity of a fundamental mode oscillation frequency of the oscillator, and the parallel resonance frequency of the composite circuit network is set in the vicinity of a B-mode resonance frequency of the SC-cut crystal unit.

DETAILED DESCRIPTION OF THE PREFERRED EMBODIMENTS

There will be explained in detail below embodiments of the present invention with reference to the attached drawings.

Figure 1:
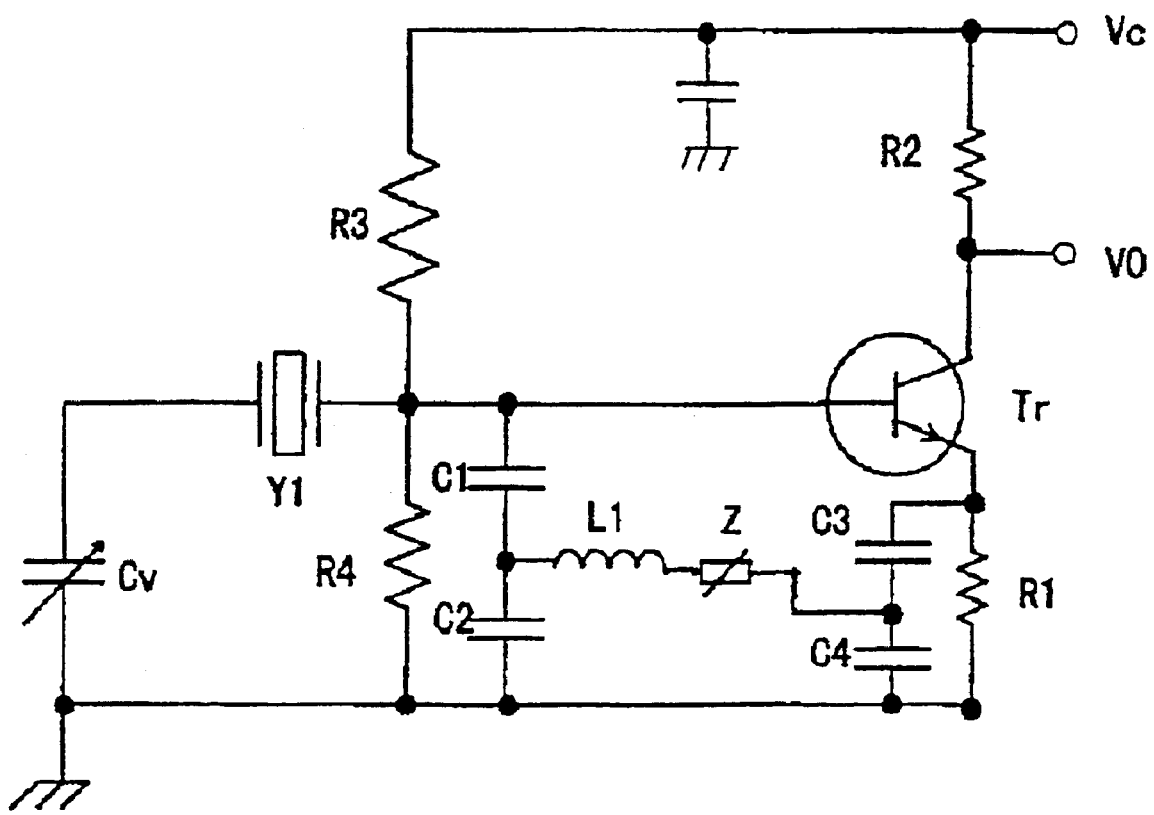
FIG. 1 is a circuit diagram for showing a structure of a Colpitts oscillator according to the present invention.

FIG. 1 is a circuit diagram for showing a structure of a Colpitts oscillator having a high-stability oscillation characteristics according to the present invention. One end of a crystal unit Y1 is connected to the base of a transistor Tr as an oscillation amplifier, and the other end of the crystal unit Y1 is grounded through a variable capacitance Cv.

A series circuit of capacitances C1 and C2 is connected to between the base of the transistor Tr and the ground. A series circuit of capacitances C3 and C4 is connected to between the emitter and the ground, and a series circuit of an inductance L1 and a variable reactance Z is connected to the connection point (split point) between the capacitances C1 and C2 and to the connection point between the capacitances C3 and C4.

Then, a feedback resistor R1 is connected between the emitter of the transistor Tr and the ground, and a load resistor R2 is connected between the collector of the transistor Tr and a power source Vc. A bleeder resistor R3 is connected between the power source Vc and the base of the transistor Tr, and a breeder resistor R4 is connected between the base of the transistor Tr and the ground.

An oscillation output V0 is obtained from the collector of the transistor Tr.

When a Colpitts oscillator having high-stability oscillation characteristics is manufactured by using an SC-cut crystal unit, a frequency jump phenomenon occurs sometimes, and this deteriorates the frequency stability of the oscillator. In order to solve this problem, the present invention has been made based on the inference that it is possible to suppress the frequency jump phenomenon by adding a circuit to the feedback circuit of the oscillator that becomes a path when the frequency is in the C mode and that attenuates when the frequency is in the B mode.

Figure 2:
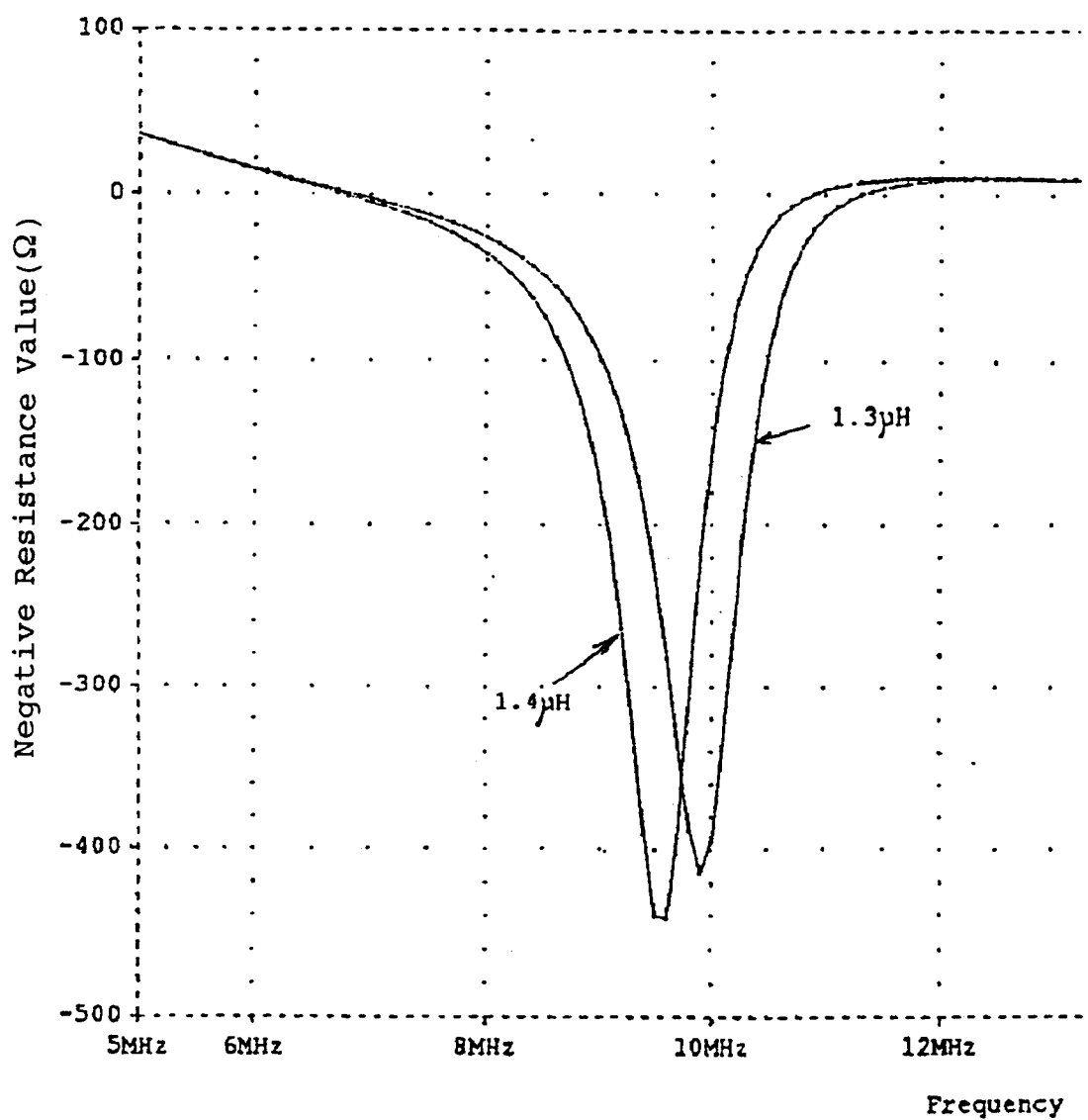
FIG. 2 is a simulation diagram of negative resistance characteristics of the Colpitts oscillator according to the present invention.

Then, by using the Colpitts oscillation circuit shown in FIG. 1, a simulation of negative resistance of the oscillation circuit has been carried out by changing a circuit constant of a composite circuit network including the capacitances Cl, C2, C3 and C4 and the inductance (L1+Z). As a result the negative resistance characteristics of narrow band shown in FIG. 2 has been obtained when the following constants are used: the capacitance C1=100 pF, C2=C3=C4=200 pF, Cv=50 pF, resistor R1=1 kΩ, R2=220 Ω, R3=R4=10 Ω, and inductance (L1+Z)=1.3 $\mu$H to 1.4 $\mu$H.

From the negative resistance characteristics shown in this diagram, it has become clear that a sufficiently large negative resistance can be obtained in the frequency of the main oscillation (C mode), and a negative resistance is extremely small but is positive in the frequency (10.9 to 11.0 MHz) of the B mode.

In other words, it is possible to obtain a circuit that generates only the main oscillation (C mode) and that completely suppresses the oscillation of the B mode.

In this case, the series resonance frequency of the composite circuit network substantially coincides with the frequency of the C mode, and the parallel resonance frequency of the composite circuit network substantially coincides with the frequency of the B mode.

In order to confirm the negative resistance characteristics of the above oscillation circuit by experiments, the negative resistance characteristics of an oscillation circuit manufactured by trial were measured by using the following circuit constants: the capacitance C1=100 pF, C2=C3=C4=200 pF, Cv=50 pF, resistor R1=1 kΩ, R2=220 Ω, R3=R4=10 Ω, and inductance L1=1.3 $\mu$H and Z=0 to 0.3 $\mu$H. A result of the measurement is as shown in FIG. 3.

The negative resistance characteristics of the case where only the combined inductance (L1+Z) is changed from 1.3 $\mu$H to 1.5 $\mu$H with the other constant values set constant is shown by an arrow mark.

Figure 3:
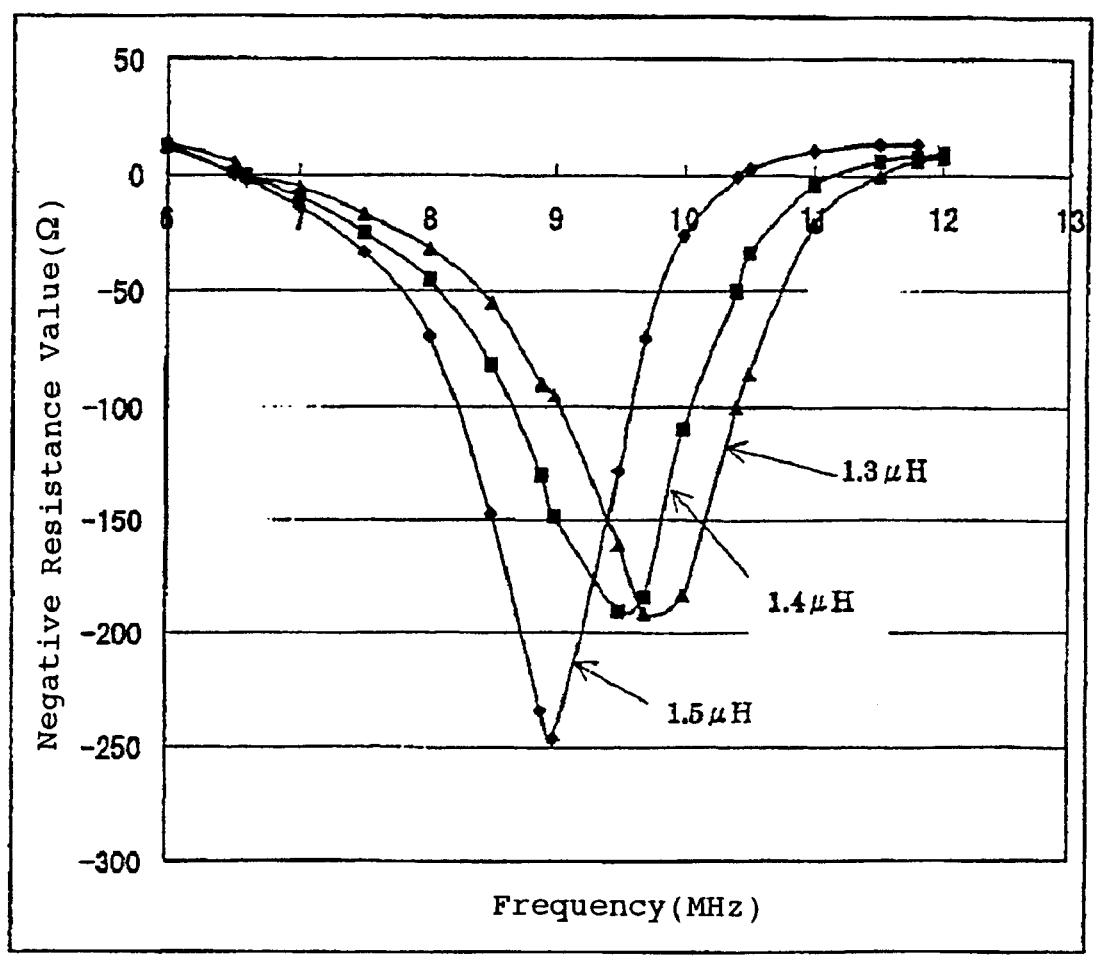
FIG. 3 is a diagram for showing an actual measurement of negative resistance characteristics of the Colpitts oscillator according to the present invention.

As is clear from FIG. 3, it has also be confirmed by experiments that when the value of the combined inductance (L1+Z) is adjusted, the series resonance frequency defined by the parameter of the capacitance C2, the combined inductance (L1+Z), and the parallel resonance frequency defined by the parameter of the capacitances C2, C4, the combined inductance (L1+Z) are changed, so that it is possible to set the negative resistance characteristics to desired characteristics.

It has, of course, been confirmed by experiments that it is also possible to shift the negative resistance characteristics to a high frequency side and to a low frequency side even when the inductance (L1+Z) is made constant and the capacitances C1, C2, C3 and C4 are changed.

As an example of the design of the Colpitts oscillator using an SC-cut crystal unit of 10 MHz by utilizing the negative resistance characteristics shown in FIG. 3, the inductance value is set such that the peak value of the negative resistance characteristics substantially becomes about 10 MHz.

Then, it is confirmed whether or not the absolute value of the negative resistance characteristics in the frequency of 10.9 to 11.0 MHz of the B mode becomes smaller than an effective resistance Rb of the B mode.

If the absolute value is not smaller than the effective resistance Rb, the inductance Z is changed to a larger value to slightly shift the negative resistance characteristic curve to the low frequency side, and the inductance Z is set so that the absolute value of the negative resistance becomes at least a few times of an effective resistance Rc of the C mode at 10 MHZ and the absolute value of the negative resistance in the frequency of the B mode becomes smaller than an effective resistance Rb.

There will be explained the operation of the oscillation circuit shown in FIG. 1. As the reactance of the capacitances C3 and C4 is smaller than the resistance value of the feedback resistor R1, a part of the collector current returns in the circuit consisting of the capacitance C3, the combined inductance (L1+Z) and the capacitance C2, and other collector currents return through the capacitances C3 and C4.

In this case, the series circuit consisting of the capacitance C2 and the combined inductance (L1+Z) is set to present a resonance status in the oscillation frequency of the C mode of the crystal unit Y1. At the same time, the parallel resonance frequency defined by the parameter of the capacitances C2, C4 and the combined inductance (L1+Z) is set to the vicinity of the frequency of the B mode. Accordingly, it is possible to obtain the negative resistance characteristics as shown in FIG. 3 and it is possible to oscillate in only the C mode.

In other word, according to the prior-art technique described in the description of the related art, the series resonance frequency of the crystal unit or the L and C oscillation circuit added to the oscillation loop is coincided with the oscillation frequency of the C mode, thereby to obtain only the C mode. However, as the oscillation frequency of the C mode is close to the oscillation frequency of the B mode and also as the oscillation level of the B mode that is the unwanted wave is large, it has not been possible to obtain a desired effect when the series resonance frequency of the added circuit is coincided with the oscillation frequency of the C mode. On the contrary, according to the structure of the present invention, an oscillation status is obtained by the C mode oscillation frequency of the crystal unit Y1 by using the series circuit consisting of the capacitance C2 and the combined inductance (L1+Z). Further, the parallel resonance frequency defined by the parameters of the capacitances C2, C4 and the combined inductance (L1+Z) is close to the B mode oscillation frequency that is the unwanted wave. Therefore, it is possible to securely generate the C mode oscillation and to restrict the B mode oscillation.

In the above, a description has been made of the present invention by using the composite circuit network in which the series circuit of the inductance L1 and the variable reactance Z is included, however, the present invention is not limited to the above structure. That is, instead of the series circuit of L1 and Z, another circuit having an inductance component can be used so that the other circuit is inserted between the connection point of the series circuit of the capacitances C1 and C2 and the connection point of the series circuit of the capacitances C3 and C4.

Figure 4:
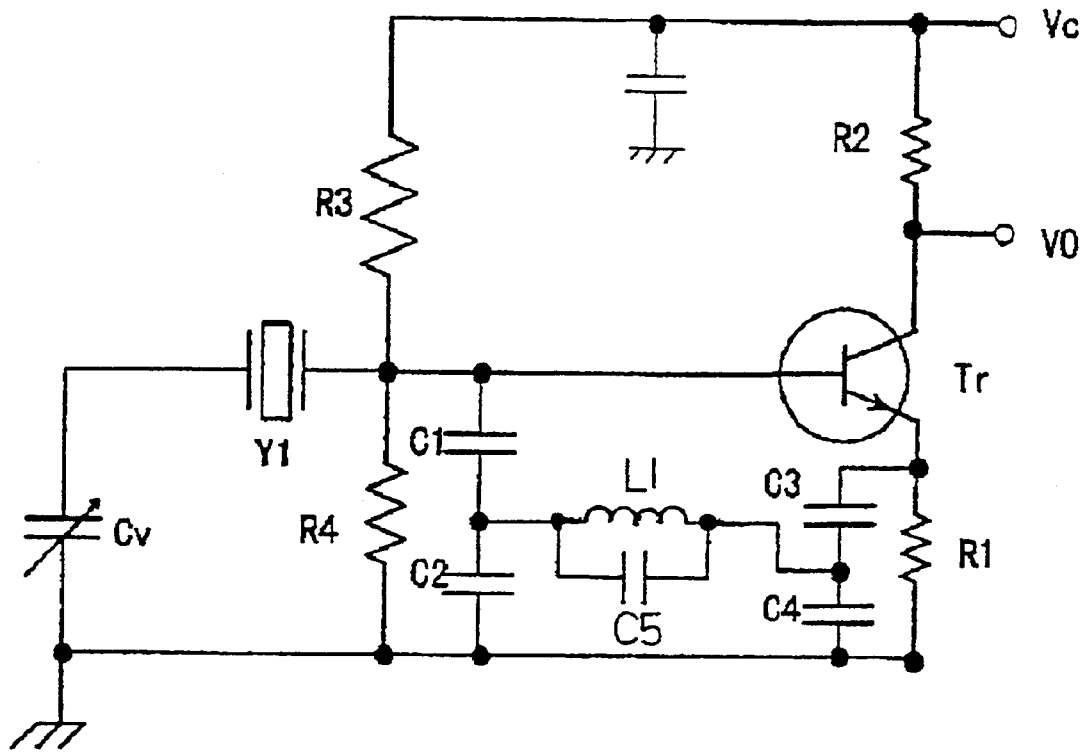
FIG. 4 is a circuit diagram for showing another embodiment of the Colpitts oscillator according to the present invention.
Figure 5:
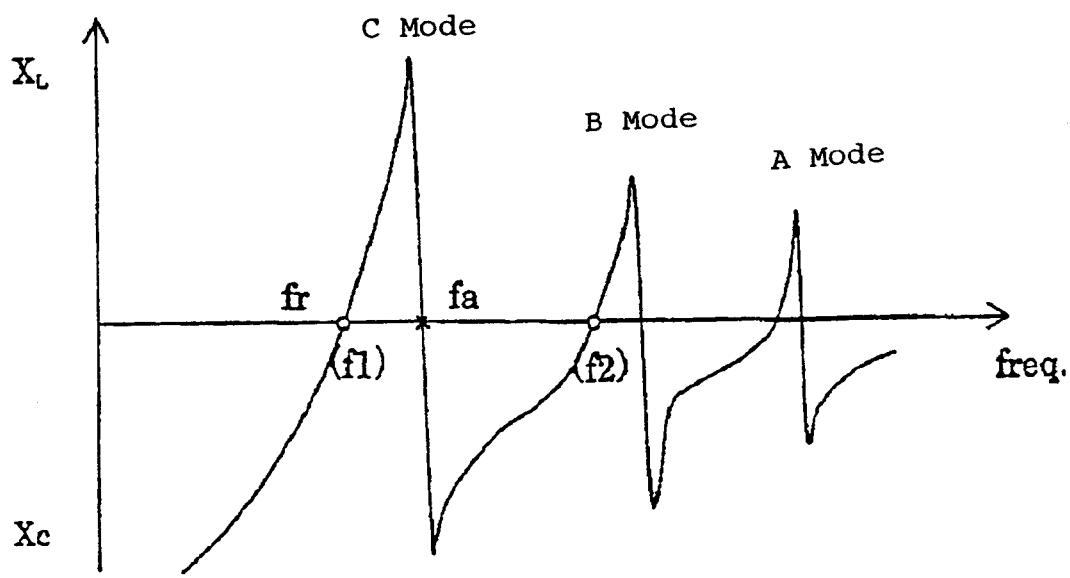
FIG. 5 is a diagram for showing a frequency spectrum of an SC-cut crystal unit.
Figure 6:
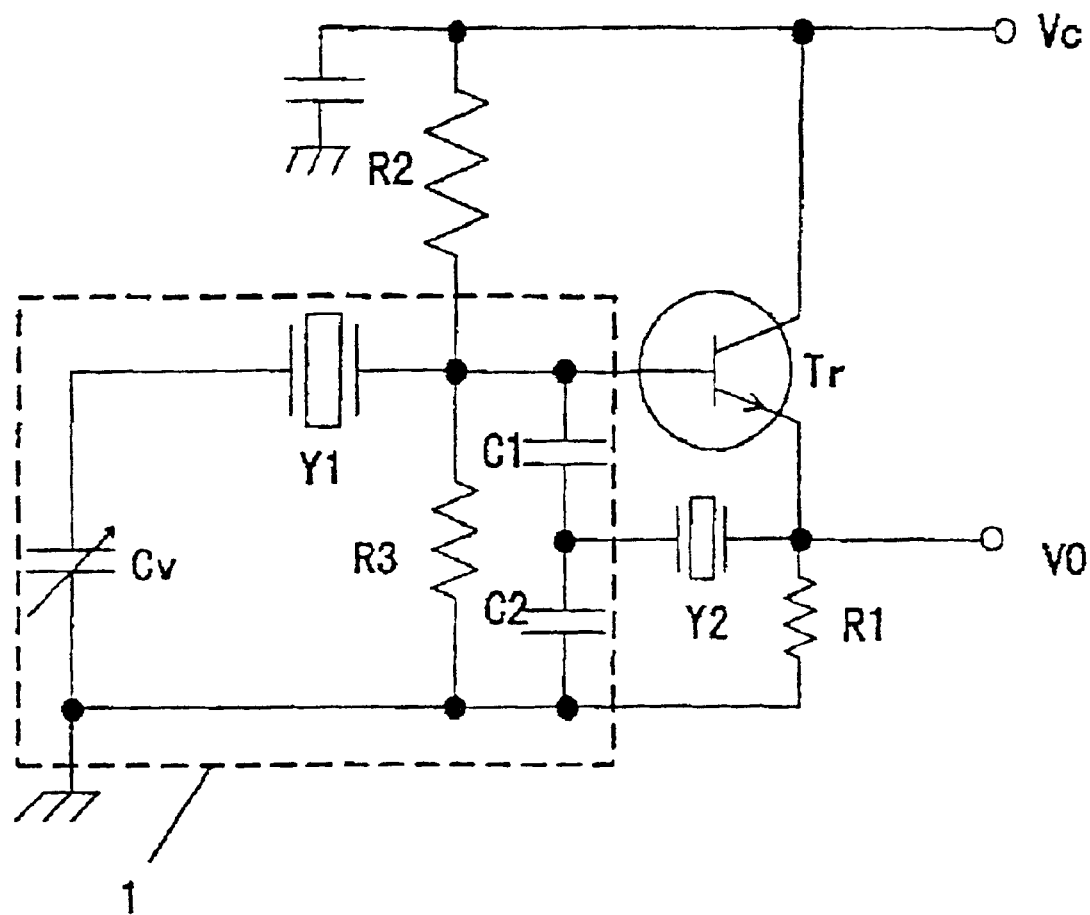
FIG. 6 is a diagram for showing a circuit structure of a prior-art Colpitts oscillator using SC-cut quartz unit.
Figure 7:
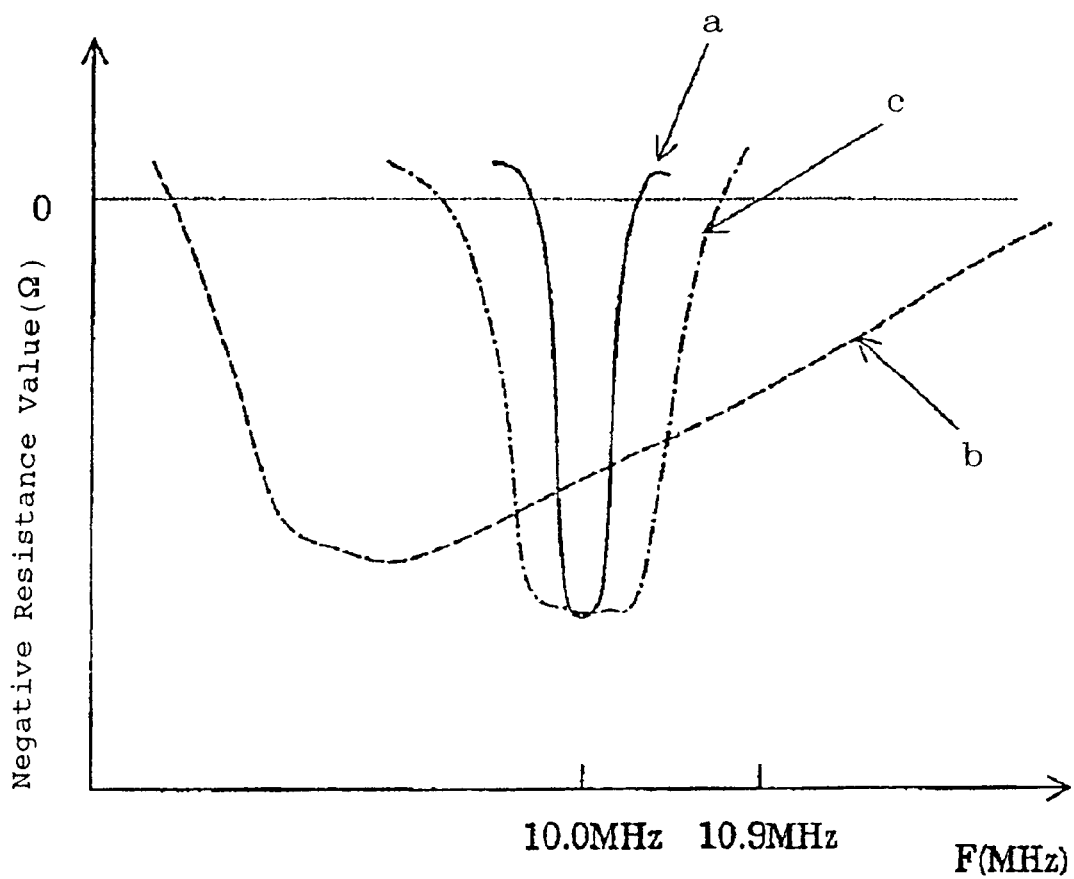
FIG. 7 is a diagram for showing negative resistance characteristics, wherein a represents the characteristics of the case of using an AT-cut crystal unit as a feedback circuit, b represents the characteristics of a Colpitts oscillator, and c represents the characteristics of the case of using an L and C series resonance circuit as a feedback circuit.
Figure 8:
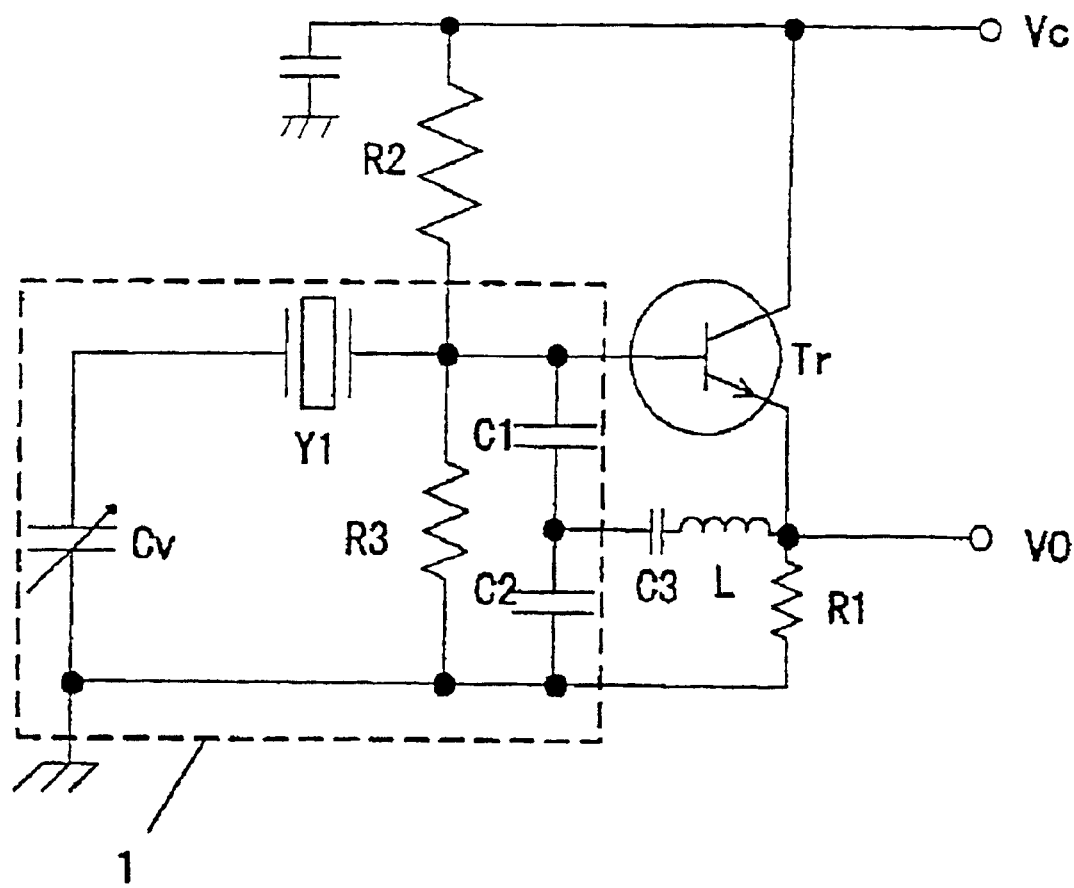
FIG. 8 is a diagram for showing a circuit structure of a Colpitts oscillator including an L and C series resonance circuit as a feedback circuit and an SC-cut quartz unit.
Figure 9:
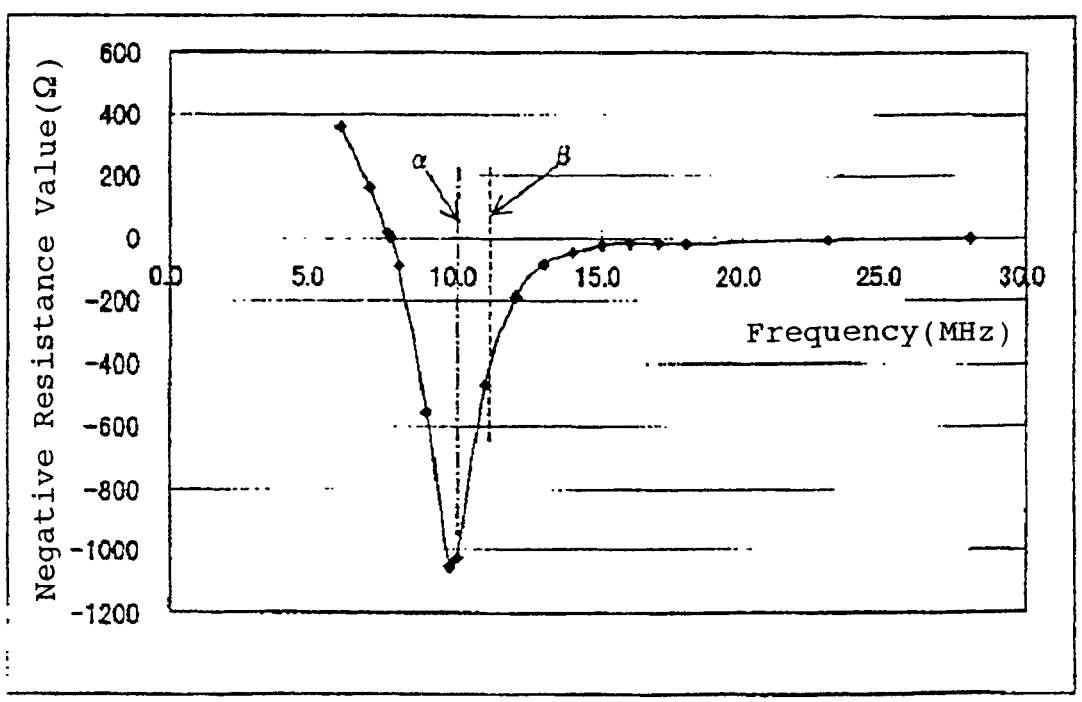
FIG. 9 is a diagram for showing a measurement of negative resistance characteristics of the Colpitts oscillator including the L and C series resonance circuit as a feedback circuit, and the SC-cut quartz unit.

FIG. 4 is a circuit diagram for showing another embodiment of the crystal oscillator based on the present invention. The crystal oscillator shown in FIG. 4 has the same structure as the crystal oscillator shown in FIG. 1, except that the composite circuit network is structured by connecting the connection point of the series circuit of the capacitances C1 and C2 and the connection point of the series circuit of the capacitances C3 and C4 through a parallel circuit of the inductance L1 and a capacitance C5.

In this case, the series resonance circuit structured by the capacitances C2, C5 and the inductance L1 is set so that the resonance frequency of this series circuit becomes equal to the oscillation frequency of the C mode. Further, the parallel resonance circuit structured by the capacitances C2, C4 and C5 and the inductance L1 is set so that the resonance frequency of this parallel circuit becomes equal to the frequency of the B mode. By adopting the structure shown in FIG. 4, it is possible to set the desired resonance frequencies of the series circuit and the parallel circuit without using a large inductance value for the inductance L1. Thus, the composite circuit network is less affected by the influence of the inductance having extreme changes in electric characteristics along with changes in temperature.

A description has been made in the above about the suppression of the frequency jump phenomenon, that is, the suppression of the B mode oscillation, in the Colpitts oscillator using an SC-cut crystal unit. However, it is needless to mention that the application field of the present invention is not limited to this, but the invention can also be applied to the suppression of unwanted waves of the oscillator using other piezoelectric resonator, for example, an AT-cut crystal unit.

As explained above, by adding only an inductance, a variable reactance and two capacitances, it becomes possible to make smaller the absolute value of the negative resistance in the B mode frequency than the effective resistance of the B mode while keeping the negative resistance in the C mode frequency at a sufficient value. As a result, there is an effect that it is possible to stably manufacture a Colpitts oscillator having a high-stability characteristics of the oscillation using a crystal unit, for example, an SC-cut crystal unit, an AT-cut crystal unit.

Further, there is an effect that when the Colpitts oscillator of the present invention is used in a mobile communications radio base station or the like, it is possible to increase the quality of communications.

What is claimed is:

1. A Colpitts oscillator including a piezoelectric resonator and an amplifier circuit, comprising:

first and second capacitances inserted in series into the piezoelectric resonator;

a feedback resistor connected between an emitter of a transistor amplifier of said oscillator and ground;

third and fourth capacitances provided in parallel to said feedback resistor and connected in series between the emitter of said transistor amplifier and the ground;

at least an inductance element provided between a connection point between the first and second capacitances and a connection point between the third and fourth capacitances; and wherein a parallel resonance frequency that is defined by parameters of said inductance element and the second and fourth capacitances is set in the vicinity of an unwanted oscillation frequency of the oscillator, thereby to suppress unwanted oscillation.

2. A Colpitts oscillator including a piezoelectric resonator, a transistor amplifier, and at least capacitances C1 and C2 inserted in series into the piezoelectric resonator and a feedback resistor R1 connected between an emitter of the transistor of the amplifier and the ground, wherein a series connection of capacitances C3 and C4 is provided between the emitter of the transistor and the ground, and an inductance is inserted between and connected with a connection point between the capacitances C3 and C4 and a connection point between the capacitances C1 and C2 so that a composite circuit network is formed including the inductance, the capacitances C1, C2, C3 and C4 in the oscillation loop, and within the composite circuit network a parallel resonance frequency that is defined by parameters of the inductance and capacitances C2 and C4 is set in the vicinity of an unwanted oscillation frequency of the oscillator, thereby to suppress unwanted oscillation.

3. A Colpitts oscillator according to claim 2, wherein a circuit having a fixed inductance L1 and a variable reactance Z connected in series is used as the inductance.

4. A Colpitts oscillator including a piezoelectric resonator, a transistor amplifier, at least capacitances C1 and C2 inserted in series into the piezoelectric resonator, and a feedback resistor R1 connected between an emitter of the transistor of the amplifier and ground, wherein a series connection of capacitances C3 and C4 is disposed between the emitter of the transistor and the ground, and a parallel circuit of an inductance and a capacitance is inserted between and connected with a connection point between the capacitances C3 and C4 and a connection point between the capacitances C1 and C2 so that a composite circuit network is formed including the parallel circuit and the capacitances C1, C2, C3 and C4 in the oscillation loop, and within the composite circuit network a parallel resonance frequency that is defined by parameters of said parallel circuit and capacitances C2 and C4 is set in the vicinity of an unwanted oscillation frequency of the oscillator, thereby to suppress unwanted oscillation.

5. A Colpitts oscillator according to claims 1, 2, or 4, wherein the piezoelectric resonator is an SC-cut crystal unit, and the parallel resonance frequency is set to a B-mode resonance frequency of the SC-cut crystal unit.

6. A Colpitts oscillator according to claim 3, wherein the piezoelectric resonator is an SC-cut crystal unit, and the parallel resonance frequency is set to a B-mode resonance frequency of the SC-cut crystal unit.

* * * * *